July 22, 1969 F. P. MULSKI 3,457,472

SEMICONDUCTOR DEVICES ADAPTED FOR PRESSURE MOUNTING

Filed Oct. 12, 1966

INVENTOR:
FRANCIS P. MULSKI,
BY Albert S. Richardson Jr.
ATTORNEY

United States Patent Office 3,457,472

Patented July 22, 1969

3,457,472
SEMICONDUCTOR DEVICES ADAPTED FOR PRESSURE MOUNTING

Francis P. Mulski, Wallingford, Pa., assignor to General Electric Company, a corporation of New York Filed Oct. 12, 1966, Ser. No. 586,188
Int. Cl. H01l 5/08, 1/02
U.S. Cl. 317—234 3 Claims

ABSTRACT OF THE DISCLOSURE

In a pressure-mounted semiconductor rectifier, a silicon body is sealed in a housing comprising a ring-like gate electrode disposed between two coaxial insulator rings whose inner surfaces are chamfered to avoid accidental short circuits between the gate electrode and the cathode terminal member of the housing, and a stack of thin gold-nickel disks of progressively smaller diameters are concentrically bonded to the substrate of the silicon body to form a cost-saving anode contact thereon.

This invention relates to improvements in semiconductor rectifier devices of the kind wherein broad area contact between a pair of main electrodes and an interposed semiconductor body is obtained by means of pressure.

High-current solid state rectifiers made of semiconductor material (e.g., silicon) are becoming increasingly popular in the art of electric power conversion. In order safely to conduct an average forward current of 250 amperes or more, a relatively broad area semiconductor body is required. Typically such a body is in the shape of a thin, disc-like multilayer wafer sandwiched between flat metal electrodes that are joined to opposite ends of a hollow insulator to form a sealed housing or package for the wafer. If a 2-layer (PN) silicon wafer is used, the device is a simple rectifier or diode, whereas if a 4-layer (PNPN) wafer with a gate contact is used, the device is a controlled rectifier known in the art as a thyristor or SCR. In the latter case, the housing will also have a control electrode for connecting an external control circuit to the gate contact of the interior wafer.

In a high-current device, the requisite low-resistance broad area contact between the silicon wafer and the adjoining main electrodes can be advantageously obtained by clamping these parts together under high pressure. It is a general objective of the present invention to provide an improved semiconductor device of this kind.

A more specific objective of my invention is to provide an improved high-current semiconductor rectifier device adapted for pressure mounting and characterized by increased reliability and reduced manufacturing costs.

In carrying out my invention in one form, the control electrode of the device comprises a metal ring that traverses the insulator wall and is connected inside the device to the gate contact of the silicon wafer. I minimize the possibility of an accidental short circuit between this control electrode and the closest main electrode by using a ring whose inside diameter is larger than that of the insulator and by chamfering the inner surface of the insulator in the vicinity of this ring.

In another aspect of the invention, the silicon wafer has a tungsten or molybdenum substrate whose distal end is characterized by a concave surface. Bonded to this surface is a facing of noble metal whose exterior face is made flat, whereby low-resistance broad area pressure contact can be maintained between this face and the adjoining main electrode. In accordance with this aspect of my invention, the noble metal facing actually comprises a plurality of thin disks of diverse diameters concentrically bonded to the distal end of the substrate and then finished to form the desired flat exterior face.

Figure 1:
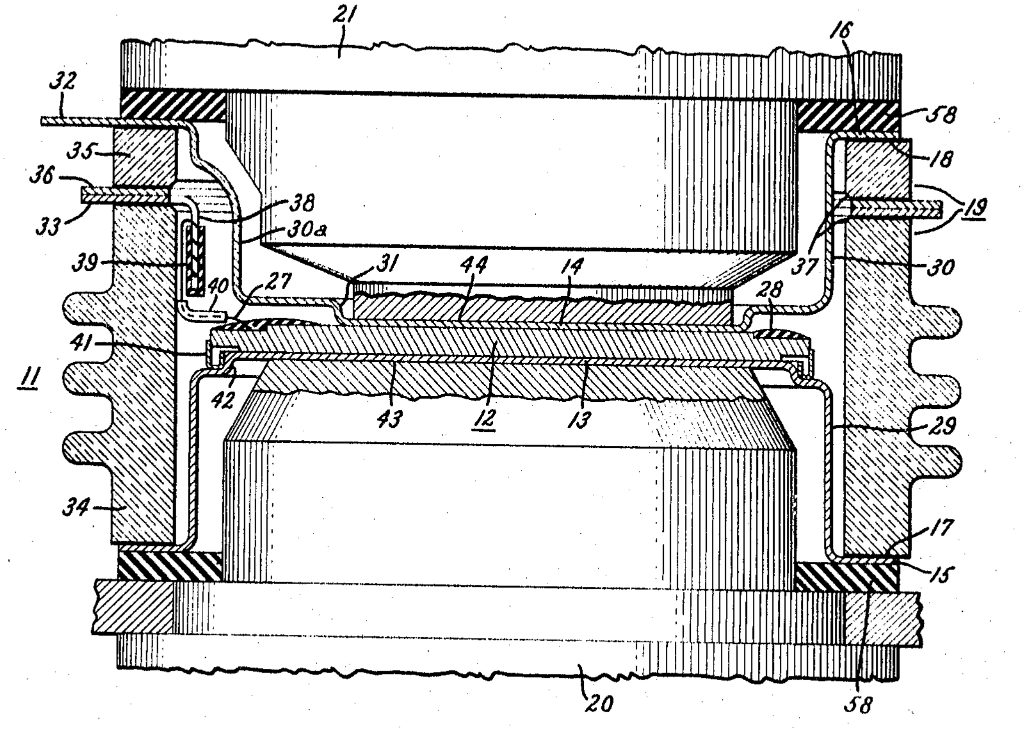
Figure 1A:
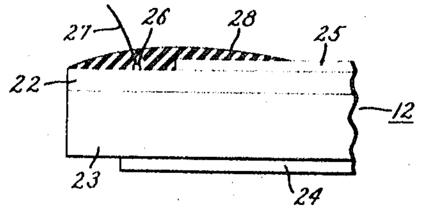
Figure 2:
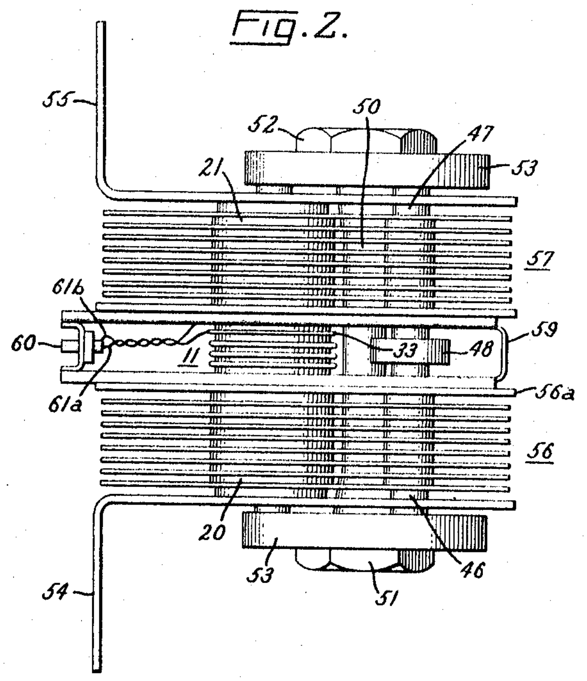
Figure 3:
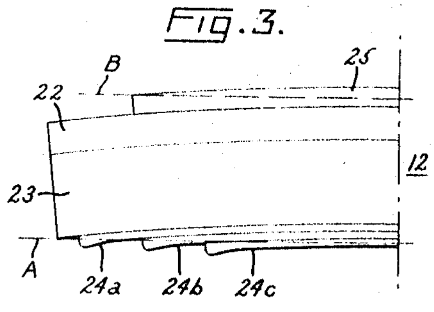

My invention will be better understood and its various objects and advantages will be more fully appreciated from the following description taken in conjunction with the accompanying drawing in which:

FIG. 1 is a magnified elevational view, in section, of a high-current semiconductor controlled rectifier device embodying my invention;

FIG. 1*a* is an enlarged fragmentary detail of the semiconductor body that is enclosed in the device shown in FIG. 1;

FIG. 2 is a side elevation of a preferred pressure mounting assembly for the device shown in FIG. 1; and FIG. 3 is an enlarged profile of the semiconductor body illustrating the appearance of this body during the process of its manufacture.

FIG. 1 shows a high-current semiconductor rectifier device 11 which will now be described in detail, with the understanding that, except where otherwise indicated below, a plan (horizontal) view of the device would reveal that its various parts are circular. Following this description, the specification will conclude with claims pointing out the particular features of the device 11 that I regard as my invention. Other features of the described device are not my invention but are the claimed subject matters of co-pending patent applications filed concurrently herewith for F. R. Sias (S.N. 585,428) and D. C. Piccone (S. N. 586,187), both assigned to the assignee of the present application.

The device 11 is seen to include a disc-like body 12 sandwiched between the flat bottoms 13 and 14 of a pair of dished terminal members. The rims 15 and 16 of the latter members are bonded, respectively, to opposite ends 17 and 18 of a hollow electrical insulator 19 to thereby form an integral, hermetical sealed housing for the body 12. This device, as illustrated, is mounted under pressure between the opposing ends of a pair of aligned copper thrust members or posts 20 and 21 that serve as combined electrical and thermal conductors. The preferred mounting arrangement is shown in FIG. 2 and will be described later.

The interior disc-like body 12 of the device 11 is made of semiconductor material. More specifically, as is indicated in FIG. 1*a*, it preferably comprises a thin (e.g., 18 mils) relatively broad area, circular slice of asymmetrically conductive silicon 22 on a thicker (e.g., 60 mils) disc-like substrate 23 of tungsten or molybdenum, with a gold-nickel facing 24 (e.g., 94% gold, 6% nickel) on the distal end of the substrate 23 and a thin gold contact 25 overlying the top surface of the silicon 22. Thus the semiconductor body 12 has oppositely disposed metal faces.

The body 12 can be constructed by any of a number of different techniques that are well known in the art today. Its diameter typically is 1.25 inches. Internally, the silicon wafer 22 will have at least one broad area PN rectifying junction generally parallel to its faces. The device shown for illustration purposes is actually a thyristor (i.e., a controlled rectifier), and its wafer is therefore characterized by four layers of silicon of alternately P and N type conductivity, one of which is provided with a peripheral gate contact 26 to which a flexible gate lead 27 is ohmically connected. It will be assumed that a P layer of 22 is ohmically connected to the substrate 23, whereby the forward direction of conventional current through the body 12 is from the main contact 24 to the main contact 25. Preferably the exterior surfaces of these contacts are made truly parallel to each other and perpendicular to the axis of the body 12. A protective coating 28 of insulation (e.g., silicone rubber) is then deposited on the annular area of the body 12 radially beyond the upper face of its contact 25 and on the part of this face that is adjacent to the peripheral gate contact 26.

The semiconductor body 12 becomes bowed during its manufacturing. This is shown, enlarged and exaggerated, in FIG. 3. Consequently the distal end of the circular substrate 23 of this body is characterized by a concave surface. The degree of concavity will be less if the substrate is made of tungsten instead of molybdenum. As already mentioned, the exterior faces of the finished body 12 are preferably flat and parallel, and therefore the gold-nickel facing 24 on the substrate 23 and the gold contact 25 overlaying th silicon wafer 22 will be ground and/or lapped to produce planar surfaces along the respective lines A and B shown in FIG. 3. In accordance with my invention, precious metal and money are saved by forming the contact 24 from at least two thin disks of different diameters. Actually three 1 mil thick disks **24*a*, 24*b*, and 24*c*** have been used in FIG. 3, and it will be understood that all three are made of principally a noble metal, preferably gold. (By "principally" a noble metal I mean either a pure noble metal or an alloy containing more than 50% noble metal.)

The first disk **24*a* of largest diameter is concentrically disposed against the distal end of the substrate 23, the second disk 24*b* of intermediate diameter is concentrically stacked against the disk 24*a*, and the smallest disk 24*c* is concentrically stacked on the second disk 24*b*. All three disks are bonded together and bonded to the lower surface of the substrate by an alloying process or the like. After this is done the silicon wafer 22 is alloyed to the other surface of the substrate 23, which step leaves the body 12 bowed as noted. FIG. 3 depicts the resulting structure before the finishing steps of grinding and lapping. It will be apparent that if the diameters of the disks 24*b* and 24*c* were enlarged to equal the diameter of the disk 24*a*, the additional material would be wasted. To obtain the desired result it is not essential that the staggered disks be precisely centered on the substrate, or that the finished surface be entirely free of depressions. Thus an annular furrow in the contact surface circumscribing the disk 24*b*** will not materially reduce the effective area of the exterior flat face of this contact.

As can be seen in FIG. 1, the opposite faces of the body 12 respectively adjoin and are in contact with opposing plane surfaces of the parallel bottoms 13 and 14 of the spaced-apart terminal members of the device 11. These parts conduct load current between the posts 20 and 21 and the interior body 12 and therefore serve as the main electrodes of the device (hereinafter referred to as anode 13 and cathode 14). Each is in the form of a flat, uniformly thick, generally circular disk of conductive material, such as nickel-plated copper, although tungsten or molybdenum could be used if desired.

The anode 13 is joined to the insulator 19 by means of a sidewall 29 of thin ductile metal (e.g., copper) integrally connected to the flared rim 15 which in turn is concentrically attached by brazing or the like to a metalized lower end 17 of the insulator. Thus the components 13, 15, and 29 comprise an integral cup-shaped terminal member whose sidewall 29 is part of a somewhat elastic annular diaphragm through the mid portion of which the anode 13 projects. The sidewall 29 extends inside the hollow insulator 19, and as shown its diameter is smaller than the inside diameter of the insulator, whereby a minimum annular space is maintained between the sidewall and the inner periphery of the insulator. A generally similar terminal member is formed by the cathode 14, the rim 16, and an interconnecting sidewall 30.

It will be observed in FIG. 1 that a peripheral segment has been omitted from the left side 31 of the cathode 14, thereby correspondingly relieving the electrode surface that adjoins the upper face of the body 12 in the vicinity of the peripheral gate contact 26. This is done to prevent main contact pressure from being exerted on the body 12 too close to its gate contact. It will also be observed that the peripheral edge portion or rim 16 of the sidewall 30 connected to the cathode 14 has a conductive tab 32 projecting radially outwardly from the left side thereof. The tab 32 extends beyond the compass of the insulator 19 where it provides a convenient place to attach an external gate-signal reference wire. Thus the tab 32, the electroconductive sidewall 30, and the cathode 14 will be part of the complete path for control current that is supplied to the gate contact 26 of the semiconductor body 12. Furthermore, because the tab 32 has been located on the side of the terminal member that is adjacent to the relieved segment 31 of the cathode 14, it can serve as a clear visual indicator of the angular disposition of this segment when installing the device 11 between the pressure-applying posts 20 and 21.

In order to make the interior gate lead 27 externally accessible, the device 11 also includes a control electrode 33 of conductive material traversing the insulator 19. The insulator 19, as is plainly shown in FIG. 1, actually comprises two axially aligned rings 34 and 35 having the same inside diameter. These rings preferably are ceramic. The part 35, whose metalized upper end 18 is brazed to the rim 16 of the cathode terminal member of the device 11, has only a short axial dimension, whereas the part 34 comprises a relatively long cylinder or sleeve surrounding not only the anode 13 and the semiconductor body 12 but also the cathode 14 and the bottom half of the sidewall 30 associated therewith.

The two ceramic parts 34 and 35 comprising the hollow insulator 19 are joined together by means of a metal ring 36 and the control electrode 33 which is also ring shaped. Both of these intermediate metal rings are coaxially disposed between the insulator parts: the metal ring 33 is bonded to the metalized upper end of the ceramic sleeve 34 and protrudes annularly beyond it, while the metal ring 36 is bonded to the metalized lower end of the ceramic ring 35 and similarly protrudes annularly beyond it. The contiguous metal rings 33 and 36 are welded together around their outer perimeters to complete the hermetically sealed housing for the semiconductor body 12. As can be seen in FIG. 2, an external gate-signal wire can be attached to the exposed edge of the control electrode 33 to connect this electrode to a remote source of control current. It should be noted at this point that the two-part insulator 19 with interposed sealing rings 33 and 36 would be a useful structure for enclosing a semiconductor body 12 even if the body had no gate contact.

In FIG. 1 it will be observed that the inside diameter of both metal rings 33 and 36 is larger than that of the ceramic rings 34 and 35. According to my invention, the inner surfaces 37 of the ceramic rings are chamfered in the vicinity of these metal rings, whereby the metallized surfaces at the adjacent ends of the ceramic rings are recessed with respect to the inside ceramic walls. This avoids the possibility of the metal sidewall 30 accidently touching these metallized surfaces and consequently shorting the gate-cathode circuit of the illustrated device.

The control electrode 33 has been provided with a conductive tab 38 extending inside the device 11. The remote end of the flexible gate lead 27 that is connected to the gate contact 26 of the semiconductor body 12 is wrapped around this tab and is conductively secured thereto by ultrasonic welding or the like. This completes a connection for control current from the electrode 33 to the gate contact 26. The distal end of the tab 38, which is bent downwardly along the inside wall of the ceramic sleeve 34 as shown in FIG. 1, is covered by an insulating jacket 39. There is also an insulating tube 40 on the short length of lead 27 that extends between ceramic sleeve 34 and the insulating coating 28 on the semiconductor body 12. With this arrangement the gate lead 27 is firmly supported by the tab 38 of the control electrode 33 without appreciable strain on the welded joint between these parts. Preferably a portion 30*a* of the annular sidewall 30 is indented to form an enlarged pocket for the gate lead 27 and the tab 38 between the ceramic sleeve 34 and this sidewall. Consequently, the sidewall 30 is non-circular.

In order to facilitate the centering of the body 12 on the anode 13 while the device 11 is being assembled and before it is installed between the pressure-applying posts 20 and 21, a positioning ring 41 has been provided. As is shown in FIG. 1, the ring 41, which can be blanked and formed from a thin strip of steel, is snugly seated on a peripheral flange 42 that is integrally connected to the anode 13, and it extends axially toward the cathode 14. The inside diameter of this extension is slightly larger than the outside diameter of the body 12. Thus the peripheral edge of the metallic substrate 23 that projects axially from the bottom surface of the silicon wafer 22 of the body 12 is located inside the ring 41. By encircling the perimeter of the lower region of the body in this manner, the ring 41 positively positions this body concentrically with respect to the anode 13.

The semiconductor body 12 is held mechanically between and electrically in series with the main electrodes 13 and 14 of the device 11 by pressure. No solder or other means is used for bonding these parts together. Electric contact between the metal faces of the body 12 and the opposing surfaces of the associated electrodes is effected merely by their pressure engagement with each other over the generally circular interface areas. This pressure is provided in the first instance by the elastic nature of the anode and cathode terminal members that are disposed on opposite sides of the device 11. In practice however the anode 13 and the cathode 14 of the device are intended to be tightly compressed between the aligned copper posts 20 and 21, whereby an even more intimate high-current, low-resistance interface connection is obtained. Any suitable external pressure mounting arrangement can be used for the device 11, and a preferred embodiment will now be described with reference to FIG. 2.

I have illustrated in FIG. 2 a pressure assembly that is the claimed subject matter of a copending patent application S.N. 577,034 filed Sept. 2, 1966, for F. R. Sias and assigned to the assignee of the present application. In essence it comprises two or more parallel sets of aligned, spaced-apart thrust members, a plurality of separable interconnection means respectively disposed in the gaps between the thrust members of these sets, at least one of the aforesaid interconnection means comprising a semiconductor device 11, and a tension member extending centrally between and parallel to the various sets of thrust members and having opposite ends mechanically connected to the respective members of each set, whereby all of the thrust members are firmly clamped against the respective interconnection means. The thrust members between which the device 11 is mechanically disposed comprise the previously mentioned copper posts 20 and 21.

The body of each of the aligned copper posts 20 and 21 has a circular cross section whose diameter is normally greater than that of the semiconductor body 12 of the device 11. As is best seen in FIG. 1, opposing ends of these posts are tapered to fit inside the cup-shaped terminal members of the device 11 where they are terminated by facing contact surfaces 43 and 44, respectively. The surface 43 of post 20 generally conforms to and parallels the adjoining external contact surface of the anode 13 of the device 11. Similarly, the surface 44 of post 21 generally conforms to and parallels the adjoining external contact surface of the cathode 14 of the device. Consequently, each of the main electrodes 13 and 14 of the device 11 is conductively coupled to one of the facing surfaces 43 and 44 of the copper posts 20 and 21 over a relatively broad area, and the device 11 is connected electrically in series with these posts.

Paralleling the set of copper posts 20 and 21 and the interposed device 11 is at least another set of spaced-apart axially aligned thrust members comprising a pair of steel posts 46 and 47. As is indicated in FIG. 2, a spacer 48 of electrical insulating material is disposed in the gap between opposing ends of the posts 46 and 47. This spacer 48 is axially compressed between posts 46 and 47, and the main electrodes of the device 11 are compressed between the posts 20 and 21, by means of the tension member which comprises an elongated steel tie bolt 50 having nuts 51 and 52 on opposite ends thereof. The nut 51 is connected to the outer ends of the posts 20 and 46 by way of a Belleville spring washer (not shown) and an insulating collar 53, while the nut 52 is connected to the outer ends of the posts 21 and 47 by way of a similar spring washer and insulating collar. Thus, by tightening the nuts on the tie bolt, the copper posts are subjected to a high axial thrust and the device 11 can be firmly but separably clamped in the assembly.

For the dual purposes of electrically connecting the semiconductor device 11 to an external high-current circuit and of mechanically mounting the whole assembly, the copper posts 20 and 21 are furnished with takeoff means comprising a pair of L-shaped copper bars or buses 54 and 55 respectively attached to these posts. The distal ends of the bars 54 and 55 are available for bolting the assembly to suitable electroconductive support members, not shown. For added strength and rigidity, the bar 54 is also attached to the steel post 46, and the bar 55 is similarly attached to the other steel post 47.

The two copper posts 20 and 21 serve not only as mechanical supports and electrical contacts but also as thermal heat sinks for the semiconductor device 11. In order to promote the dissipation of heat from these posts, they have been equipped, respectively, with two groups 56 and 57 of spaced metal cooling fins. The first cooling fin 56*a* on the inner end of the group 56 is partially shown in FIG. 1. To avoid interfering with obtaining high contact pressure on the anode 13 and cathode 14 of the device, neither the cooling fins nor the copper posts are permitted to rest immediately against the device 11 in the vicinity of its insulator 19. Consequently there will be small gaps at opposite ends of the insulator, and washers 58 of yieldable material, such as silicone rubber, have been located in these gaps to help mechanically stabilize the insulator 19 and to prevent dust and other contaminators from entering the space around the tapered ends of the copper posts 20 and 21.

As can be seen in FIG. 2, an air baffle 59 of insulating material is installed between the two groups 56 and 57 of cooling fins. One end of this baffle provides a convenient base for a coaxial connector 60 for the gate-signal wire 61*a* that is connected to the control electrode 33 of the device 11. The shell of the connector 60 has been connected to the tab 32 associated with the cathode terminal member of the device 11 by a gate-signal reference wire 61*b* which is twisted with wire 61*a*.

When the high-current device 11 is mounted between the copper posts 20 and 21 as shown in FIG. 1, its anode 13 and cathode 14 are tightly squeezed against the interior disc-like semiconductor body 12. High pressure (e.g., 3,000 p.s.i.) is uniformly exerted on the adjoining contact surfaces of these parts, thereby ensuring good electrical and thermal conductivity across their broad-area junctions. However, the body 12 is not constrained radially except by friction.

In operation, the device 11 will be subject to temperature cycles that cause dimensional changes therein. Because the anode 13 and the cathode 14 are not made of the same material as the semiconductor body 12, these parts will have different coefficients of thermal expansion, and consequently their interengaging contact surfaces tend to slide sideways with respect to each other. More specifically, by way of example, as the device heats up from an ambient of 20° centigrade to an operating temperature of 120° C., a 0.4 inch radius of the illustrated body 12 increases approximately 0.2 mil while the contiguous surface of the anode 13 is radially expanding approximately 0.7 mil, whereby relative sliding movement of 0.5 mil occurs at this interface. For successful operation of a high-current device, it is important that such sliding or rubbing take place without pitting, welding, cracking, or otherwise deforming the engaging surfaces or damaging the silicon wafer 22. In order to aid smooth sliding movement, a very thin (e.g., less than 0.1 mil) film of inert lubricating fluid is deposited on each interface. This can be done for example by applying a drop or two of Dow Corning No. 703 diffusion pump fluid (silicone oil) to each of the oppositely disposed faces of the semiconductor body 12 during the process of assembling the device 11. The coating of oil that results has been found not only to reduce friction and to promote mechanical sliding of the interengaging contact surfaces, but also to reduce both the thermal and the electrical resistance between these surfaces.

For similar reasons, thin films of silicone oil or the like are also used in the respective interfaces of the main electrodes 13 and 14 of the device 11 and the opposing ends 43 and 44 of the external copper posts 20 and 21. Here the oil serves the additional beneficial purposes of inhibiting oxidation of the interengaging surfaces and reducing their adhesion.

Having described in detail the component parts of the illustrated semiconductor device 11, the preferred method of assembling these parts will now be briefly outlined. As a preliminary step, a first subassembly is formed by brazing the lower cup-shaped terminal member of the device, including the anode 13, to the metalized end 17 of the ceramic sleeve 34, and by brazing the ring-like control electrode 33 to the opposite end of this sleeve. Similarly, a second subassembly is formed by brazing the cup-shaped upper terminal member, including cathode 14, to the metalized end 18 of the ceramic ring 35, and by brazing the metal sealing ring 36 to the opposite side of this ceramic ring.

The first subassembly (13, 33, 34) is supported by a suitable fixture, and the centering ring 41 is seated on the peripheral flange 42 of the anode 13. Next a drop of silicone oil is applied to the exposed surface of the anode 13, and the semiconductor body 12 is placed on this surface inside the centering ring with its gate lead 27 located next to the interior tab 38 of the control electrode 33. The insulating tube 40 is slipped over the gate lead 27, and the bare end of this lead is wrapped around the tab 38 and welded thereto. After installing the insulating jacket 39, the free end of the tab 38 is bent downwardly to the position in which it is shown in FIG. 1.

The next step in the assembly process is to deposit a drop of silicone oil on the upper face of the semiconductor body 12. Then the second subassembly (14, 35, 36) can be coaxially installed on top of the first subassembly. The assembler will locate the tab 32 projecting from the rim 16 of the second subassembly so that the gate contact 26 of the semiconductor body 12 is under the relieved segment 31 of the facing surface of the cathode 14. In other words, as shown in FIG. 1 the tab 32 is positioned in alignment with the gate contact of the body 12.

To complete the assembly, the metal rings 33 and 36 are pressed together and continuously welded along their common outer perimeters. During this part of the process the operator makes sure that the tab 32 of the second subassembly remains in its angularly aligned relationship with the interior gate contact by keeping it lined up with a distinctive mark that was previously made on the exterior surface of the ceramic sleeve 34 outside the tab 38. After the rings 33 and 36 have been welded together, the semiconductor body 12 is permanently enclosed in the hermetically sealed housing or cell formed by the pair of main electrodes 13 and 14, the insulator 19, and the control electrode 33.

While I have shown and described a preferred form of my invention by way of illustration, many modifications will undoubtedly occur to those skilled in the art. I therefore contemplate by the claims that conclude this specification to cover all such modifications as fall within the true spirit and scope of the invention.

What I claim as new and desire to secure by Letters Patent of the United States is:

1. A semiconductor rectifier device comprising:
(a) a hollow electrical insulator;
(b) first and second spaced-apart metal members;
(c) a disc-like body sandwiched between said members, said body comprising
  (i) a thin circular slice of semiconductor material having at least one internal PN junction,
  (ii) a metal contact overlaying said slice, said contact having a flat exterior surface that adjoins and is in contact with said first metal member,
  (iii) a circular metallic substrate for said slice, the distal end of said substrate being characterized by a concave surface, and
  (iv) a facing of principally a noble metal on said concave surface, said facing comprising a plurality of thin disks of different diameters concentrically bonded to said distal end and then finished to form a flat exterior surface that adjoins and is in contact with said second metal member; and
(d) means for joining said members to said insulator to form a sealed housing for said body.

2. A disc-like semiconductor body comprising:
(a) a thin circular slice of semiconductor material having at least one internal PN junction;
(b) a circular metallic substrate for said slice, the distal end of said substrate being characterized by a concave surface; and
(c) a facing of principally a noble metal on said concave surface, said facing being formed by a plurality of thin discs of different diameters concentrically bonded to said distal end and then ground and lapped to produce a flat exterior surface that is substantially perpendicular to the axis of the body.

3. In a semiconductor rectifier device:
(a) a hollow electric insulator comprising first and second axially aligned rings having the same inside diameter;
(b) first and second spaced apart terminals of conductive material, said first member being joined to one end of said first ring and said second member being joined to the opposite end of said second ring,
(c) a disk-like body of semiconductor material disposed mechanically between and electrically in series with said terminal members, said body comprising:
  (i) a thin circular slice of semiconductor material having at least one internal PN junction,
  (ii) a circular metallic substrate for said slice, the distal end of said substrate being characterized by a concave surface, and
  (iii) a facing of principally a noble metal on said concave surface, said facing comprising a plurality of thin disks of different diameters concentrically bonded to said distal end and then finished to form a flat exterior surface that is substantially perpendicular to the axis of said body; and (d) means for joining said first and second rings together so as to complete a sealed housing for said body, said means including an intermediate ring of conductive material coaxially disposed between the insulator rings, said intermediate ring having an inside diameter larger than that of said insulator rings and the inner surfaces of said insulator rings being chamfered in the vicinity of said intermediate ring.

References Cited

UNITED STATES PATENTS

| | | | |
|---|---|---|---|
| 3,293,508 | 12/1966 | Boyer | 317—234.6 |
| 3,310,716 | 3/1967 | Emeis | 317—234.1 |

FOREIGN PATENTS

| | | |
|---|---|---|
| 662,743 | 8/1965 | Belgium. |

JOHN W. HUCKERT, Primary Examiner

J. D. CRAIG, Assistant Examiner

U.S. Cl. X.R.

29—591; 174—140